US006570447B2

(12) United States Patent
Cyrusian et al.

(10) Patent No.: US 6,570,447 B2
(45) Date of Patent: May 27, 2003

(54) PROGRAMMABLE LOGARITHMIC GAIN ADJUSTMENT FOR OPEN-LOOP AMPLIFIERS

(75) Inventors: Sasan Cyrusian, Scotts Valley, CA (US); Thomas Blon, Santa Cruz, CA (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 09/866,147

(22) Filed: May 25, 2001

(65) Prior Publication Data

US 2002/0175758 A1 Nov. 28, 2002

(51) Int. Cl.[7] .............................. H03F 3/45; G06G 7/24; G06G 7/16
(52) U.S. Cl. ..................... 330/254; 327/346; 327/359
(58) Field of Search ..................... 330/254; 327/346, 327/359

(56) References Cited

U.S. PATENT DOCUMENTS

| | | | | |
|---|---|---|---|---|
| 5,371,475 A | * | 12/1994 | Brown | 330/252 |
| 5,384,501 A | * | 1/1995 | Koyama et al. | 330/253 |
| 5,481,909 A | | 1/1996 | Deutsch et al. | 73/117.3 |
| RE35,154 E | | 2/1996 | Hardee | 365/189.09 |
| 5,510,738 A | * | 4/1996 | Gorecki et al. | 330/254 |
| 5,604,927 A | * | 2/1997 | Moore | 327/558 |
| 5,952,880 A | | 9/1999 | Voorman et al. | 330/254 |
| 5,999,055 A | * | 12/1999 | Kimura | 330/253 |
| 6,005,378 A | | 12/1999 | D'Angelo et al. | 323/313 |
| 6,127,815 A | | 10/2000 | Wilcox | 323/282 |
| 6,133,784 A | * | 10/2000 | Gregoire | 327/553 |
| 6,169,503 B1 | | 1/2001 | Wong | 341/136 |
| 6,218,871 B1 | | 4/2001 | Chiou | 327/77 |
| 6,316,997 B1 | * | 11/2001 | Tammone, Jr. | 330/254 |

OTHER PUBLICATIONS

"Synchronous Recording Channels—PRML & Beyond", rev. 5.61 14.E.18, 1999, published by Knowledge Tek, Inc., Broomfield, Colorado.
"PRML: Seagate Uses Space Age Technology" available on the Internet at http://www.seagate.com/support/kb/disc/prml.html, 2 pages, last accessed Apr. 9, 2001.
"Technologies—PRML" available on the Internet at http://www.idema.org/about/industry/ind_tech_prml.html, 1 page, last accessed Apr. 9, 2001.
"Reference Guide—Hard Disk Drives" available on the Internet at http://www.storagereview.com/guide2000/ref/hdd, 13 pages, last accessed Apr. 9, 2001.
"MR and PRML: Technologies in Synergy" available at on the Internet at http://www.lionsgate.com/Home/Baden/public_html_index/SCSI/Quantum_White_Pagers/MR_Head/MR, 4 pages, last accessed Apr. 9, 2001.
"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

Primary Examiner—Patricia T. Nguyen
(74) Attorney, Agent, or Firm—Brinks Hofer Gilson & Lione (57) ABSTRACT

Transconductance-based variable gain amplifiers amplify an input voltage by converting the voltage difference to a current and then amplifying the result. At least one resistor network is adjusted depending on the magnitude of the input voltage difference and the output desired. A network of MOS transistor switches with a small footprint adjusts the resistance of the input voltage circuit in a way to insure consistent resistance and low stray capacitance.

37 Claims, 9 Drawing Sheets

PROGRAMMABLE LOGARITHMIC GAIN ADJUSTMENT FOR OPEN-LOOP AMPLIFIERS

BACKGROUND

Amplifiers having a variable gain typically adjust the gain by switching resistors in and out of their circuits. These resistances change the conductance or transconductance characteristics of the amplifier. In this manner, an amplifier can be useful over a very wide range of input signals, and in particular over decades of logarithmic variation. The performance of such amplifiers may be modeled as a product of their transconductance multiplied by a transfer function of the amplifier.

Data acquisition systems may use programmable gain amplifiers in order to capture a wide variety of signals or signal amplitudes. Some programmable gain amplifiers have a gain-code to gain transfer function that is logarithmic rather than linear, which can accommodate a wide range of input signals. These amplifiers change their transconductance and thus performance by switching resistors in and out of the input network. This requires matching of precision resistors, a costly process. In addition, using a series of resistors can add significantly to the parasitic capacitance of the input network, slowing performance of the amplifier.

One way to achieve a logarithmic function is revealed in U.S. Pat. No. 5,952,880. This patent discloses an amplifier with two current-output digital-to-analog converters (DAC) providing two bias currents driving an amplifier whose gain depends on the bias currents. This technique, however, can only be implemented with bipolar junction technologies, which are much less attractive when compared to MOS (metal-oxide semiconductor) and CMOS (complementary metal-oxide semiconductor) manufacturing techniques. Another way to achieve logarithmic gains is to use a gain-code function and DAC converters to vary the bias voltage applied to transistors acting as a variable resistance in the amplifier circuit. However, MOS transistors used for their resistance by biasing at very low voltages introduce distortion, increasing the total harmonic distortion of the amplifier circuit. This is not desirable in a data acquisition system.

In addition to networks of resistors in the input circuit, amplifiers may also depend on networks of output resistances, having variable resistances. Finally, resistance networks of this type may require a large footprint in the circuit. Depending on how many amplifiers are in the circuit, the penalty in both capacitance and silicon area may be great. What is needed is a programmable amplifier with logarithmic gain steps that does not depend on large networks of precision resistors that slow or distort the amplifier, add to its cost, require a disproportionate amount of silicon area, and add to the parasitic capacitance of the circuit.

BRIEF SUMMARY

In order to address the deficiencies of the prior art, a better programmable amplifier is disclosed that meets these needs by obeying a logarithmic gain-code to gain transfer function. One embodiment of the invention is a programmable open loop amplifier having a resistance network. The resistance network has two or more resistors, connected in series, and at least one MOS transistor connected in parallel with the resistors. Each MOS transistor also has a pair of matching resistors connected in series, one on each side of the transistor, such that each series of resistor-transistor-resistor is connected in parallel with the two series resistors. The programmable controller applies either a gate voltage or ground to each transistor gate, thus setting the input resistance. The gain of the amplifier is determined by the resistance of the resistance network, in combination with the other characteristics of the amplifier circuit.

Another embodiment of the invention is a programmable open loop amplifier having an input resistance network. The amplifier is open-loop because there is no direct feedback and control of the amplification or gain of the amplifier. The circuit depends on matching resistances and switching in and out of resistance branches. The resistance network includes two input resistors connected in series, and at least one pair of input MOS transistors also connected in series, each pair then connected in parallel with the other pairs and with the two series resistors. A programmable controller applies a gate voltage or ground to the gates of the transistors to turn each pair on or off, closing or opening a path between the input terminals, and decreasing or increasing the input resistance. The voltage applied to the transistors causes them to operate in a linear or triode region of their operating range. The closed switch resistance of each pair of MOS transistors is equal to a resistance of the pair of input resistors.

In another embodiment of the invention, a programmable open loop amplifier has an output resistance network. The output resistance network comprises at least one pair of MOS transistors in series, with each pair connected in parallel. An output resistor connects each side of the MOS pairs to ground. The programmable controller applies a gate voltage or ground to each pair of output MOS transistors, and the gate voltage causes the transistors to operate in a linear or triode region of their operating range. Embodiments of the present invention are suitable for amplification of signals from DC to about 1 GHz.

DETAILED DESCRIPTION OF THE PRESENTLY PREFERRED EMBODIMENTS

In the discussion below, transistors are described as CMOS transistors, and in particular as PMOS (positive MOS) or NMOS (negative MOS) transistors. Those skilled in the art will recognize that the terms p-channel and n-channel might more accurately describe the transistors discussed herein, since these transistors are no longer manufactured by depositing metallic elements, except possibly for external connections. Rather, polysilicon is doped to either p-channel or n-channel, indicating whether the channel between source and drain conducts via depletion mode (holes) or enhancement mode (electrons). Nevertheless, the terms PMOS and NMOS are more-commonly used, and are so used herein to mean those transistors manufactured by CMOS processes.

Figure 1:
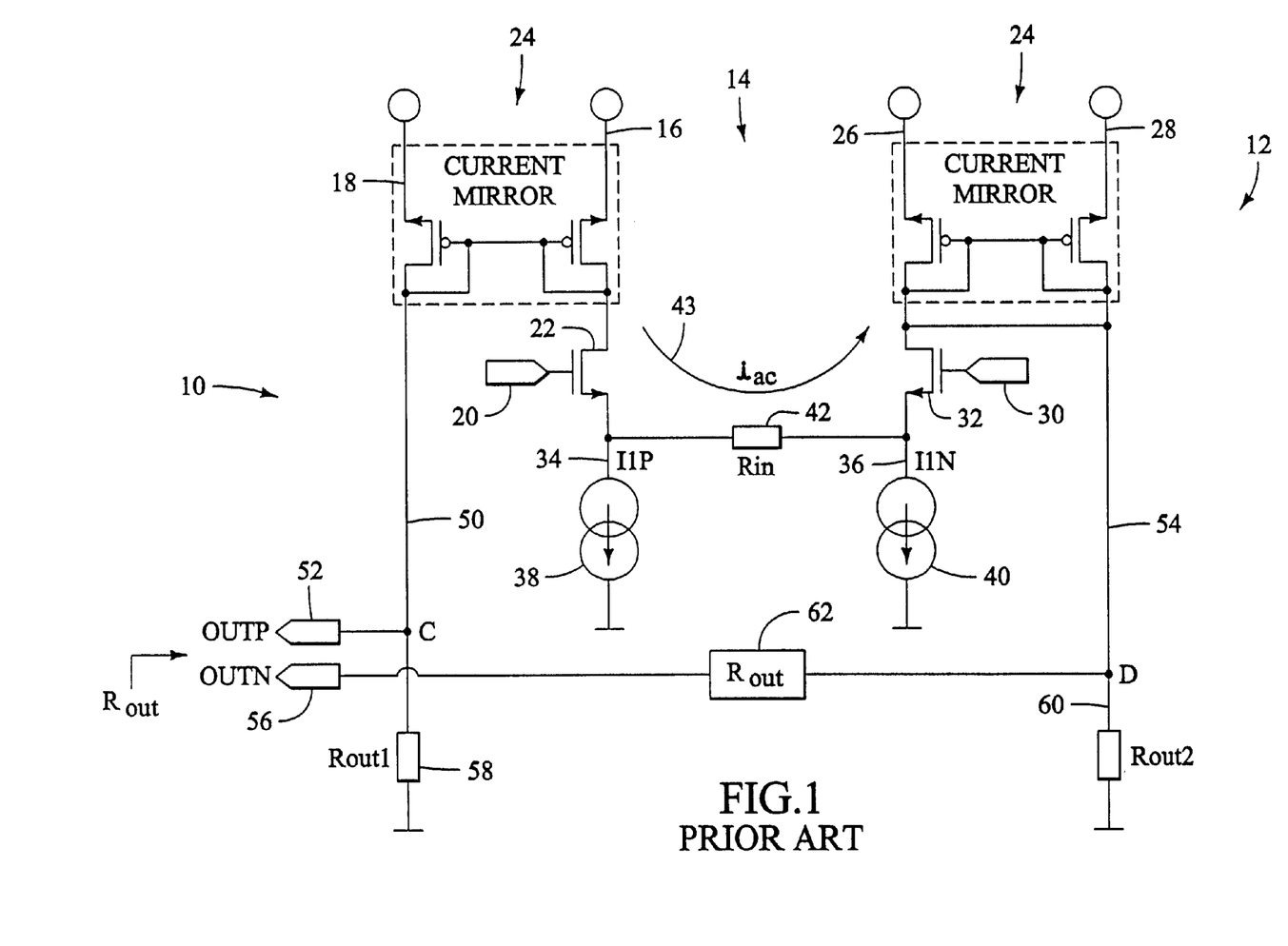
FIG. 1 is a simplified drawing of a prior art open-loop amplifier.

FIG. 1 is a simplified drawing of a prior art amplifier using a differential transconductance in its input and output portions. Amplifier 10 has an input portion 14 and output portions 24. The sources of transistors 16, 18, 26 and 28 are connected to a power source (not shown). A differential voltage input signal is input into positive terminal 20, the gate of transistor 22 and to negative terminal 30, the gate of transistor 32. The transconductance $g_m$ of transistors 22 and 32 are equal. They may be assembled as shown, in one depiction, or they may include or be connected with other components for further amplification, filtering, boosting, or to alter the input impedance, and so on. The circuit is also shown with current sources 38, 40, and an input resistance network 42 between points A and B to complete the circuit along traces 34, 36. With this circuit, a differential voltage input into the input terminals sets up a current loop 43, in which the current $i_{ac}$, shown in the figure, is equal to the input voltage difference divided by the resistance of the resistance network, $R_{in} \cdot I_{ac}$, the current induced in the input portion, is then "mirrored" and amplified by a factor of 2 in the output portion of the amplifier.

The current loop 43 set up in the input portion is mirrored and amplified by the output portions of the amplifier. On the positive side, the gate of input transistor 16 is tied to its drain and to the gate of the output transistor 18. On the negative side, the source of transistor 26 is tied to its gate and to that of transistor 28. If the transconductance $g_m$ of the output portions 24 is twice that of the input portions, then the current in the outer portion is $2 \cdot i_{ac}$. Its resistance is $R_{out}$. Therefore, the voltage out is $V_{out} = 2 \cdot i_{ac} \cdot R_{out}$. The output portion of the amplifier includes transistors 18, 28, output terminals 52, 56, and output resistances connected to traces 50 and 54 as shown: $R_{out1}$ 58 between point C and ground, and $R_{out2}$ 60 between point D and ground.

Another way to view the amplifier is to note that the output voltage will be twice the input voltage, divided by the ratio of the relative resistances $R_{out}/R_{in}$, or $V_{out} = 2 V_{in} \cdot R_{out}/R_{in}$. In such a situation, the gain of the amplifier is twice the resistance ratio, or gain $= 2 \cdot R_{out}/R_{in}$. From this context, it is clear that the performance of the amplifier is variable if a user varies the input or the output resistances. The easiest way to accomplish this is to make either the input or the output not a single resistance, but rather a resistance network. Note also that the transconductance of the amplifier is a resultant of the input portions, the output portions, and the resistance networks.

Figure 2:
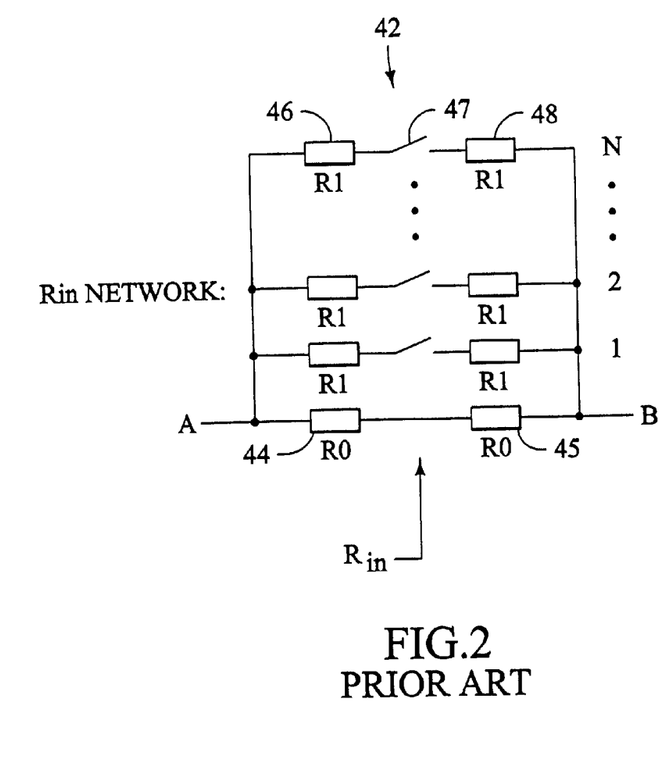
FIGS. 2 and 3 are more detailed views of prior art resistor networks.
Figure 3:
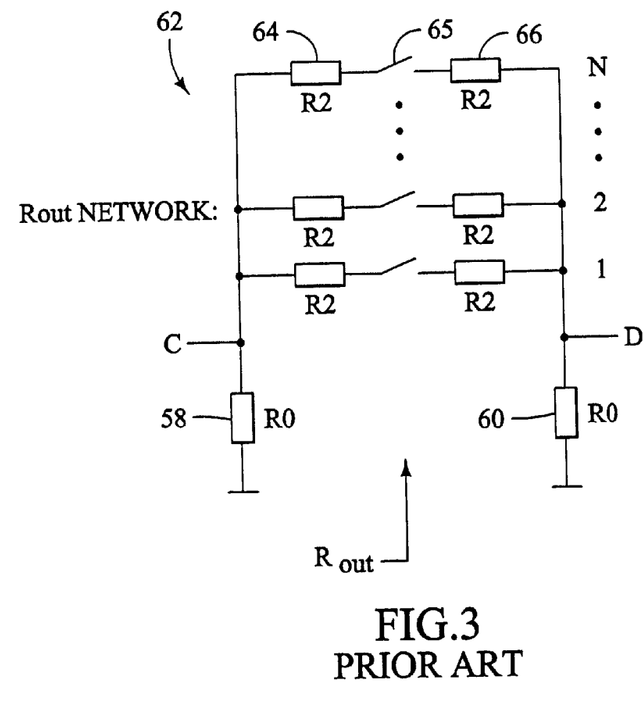

FIGS. 2 and 3 depict prior art resistor networks. In FIG. 2, resistor network 42 is connected between points A and B, where A and B may present the points A and B in FIG. 1. The network consists of a number of series pairs of resistors connected in parallel with other pairs. Series resistors 44, 45 are the minimum resistance of the circuit, in this instance, while resistors 46, 48 make up one pair of a "variable" resistor, connected or disconnected into the network by a switch 47. When switch 47 is open, resistors 46, 48 form no part of the circuit, and $R_{in}$ consists of resistors 44 and 45 only. Of course, an entire series of resistors and switches may be used, as shown in FIG. 2, one switch per pair. In that configuration, each pair of resistors is separately operable.

FIG. 3 shows an output resistance network 62, in this case with a minimum resistance, output resistors 58 and 60 connecting to ground, respectively, points C and D, the positive and negative output terminals. In addition, the output circuit resistance may be varied by pairs of resistors in series, each pair then connected in parallel with other pairs. In this depiction, resistors 64 and 66 may be put into the circuit by closing switch 65 or removed from the circuit by opening switch 65. Each pair of resistors $R_1$ has a switch and is separately operable.

In FIG. 2, each resistor in the parallel network is the same, $R_0$, and there are a finite number of pairs, N. Furthermore, the resistances of the individual resistors may be set such that $R_1 = N \cdot R_0$. In this instance, the resistance of the total $R_{in}$, is then an inverse function of number of switches closed. $1/R_{in}$ equals $(N+n)/(2 \cdot R_0 \cdot N)$, where n is the number of switches closed. The more switches that are closed, the lower the resistance of the $R_{in}$ resistance network. The same holds for the $R_{out}$ resistance. For $R_{in}$, in the case where all the switches are closed, $1/R_{in}$ will equal $R_0$, or in other words, the resistance may be halved for a maximum gain factor of 2. By going through the same calculation for the resistance out network, another factor of 2 may be attained, for a total gain possible of 4. On the other hand, by opening all switches, the gain may be set to a factor of 1, that is, no gain. In FIGS. 1 and 3, the output resistors 58 and 60 connect to ground in order to provide a common mode voltage greater than zero, by using current sources connected to points C and D to drive equal bias currents through 58 and 60.

Figure 4:
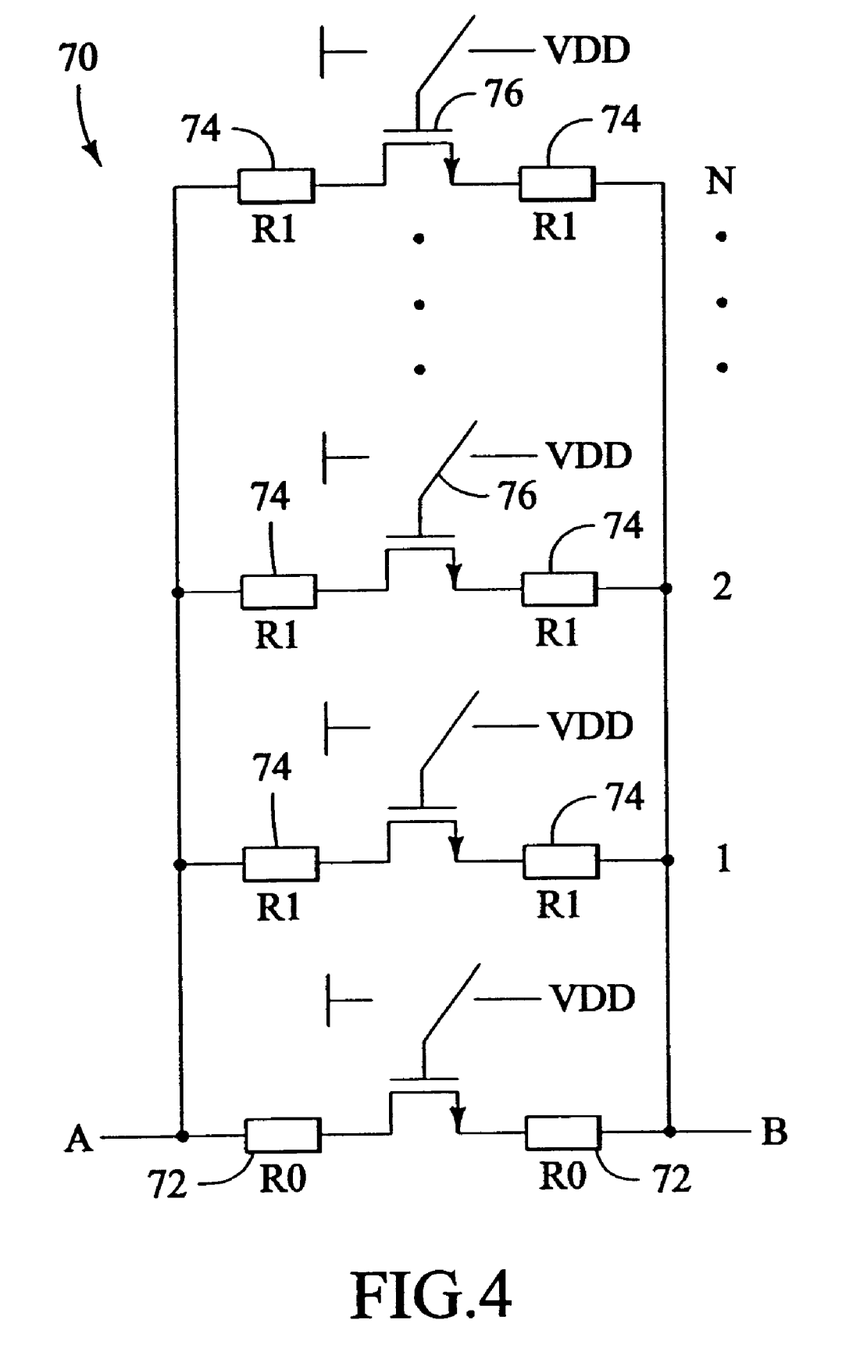
FIGS. 4 and 5 are embodiments of improved resistor networks.

FIG. 4 depicts one embodiment of an improved resistor network 70 for use in a programmable open-loop amplifier as shown in FIG. 1. The network is depicted as connecting between points A and B, where A and B may be the same points in the amplifier shown in FIG. 1. The two base $R_0$ series resistors 72 form one series of N+1 series in parallel in the resistor network. In one embodiment, there are N switched series. Each series comprises two resistors 74 and an MOS switch 76. If the switch is connected to a voltage source, the switch is closed and the series is connected in parallel. If the switch is instead connected to ground, the switch is open, and there is no contribution from that particular series.

The circuit of FIG. 4 is an improvement over the prior art. MOS transistors have the advantages of being reproducible and relatively inexpensive in this application. By MOS, metal-oxide semiconductor, is meant a range of transistors produced by MOS technology. These include p-MOS and n-mos transistors, in which p means p-channel or pnp-type, and n means n-channel or npn-type transistor. Many sorts of manufacturing technologies are used to make MOS transistors, including CMOS, in which both n-channel and p-channel transistors are made on the same wafer, in the same processes. The term MOS is meant to be inclusive of micro-miniature manufacturing techniques, using photo-lithographic techniques and layers of semiconductors, metals and oxides, to manufacture enhanced-conduction mode and depleted-conduction mode transistors.

While the transistors in the circuit are highly desirable, the resistors in this circuit require relatively large physical dimensions, such as width and length on a wafer. In addition, these relatively large components contribute undesired parasitic capacitance to each series. This capacitance would hinder and distort the frequency response of the amplifier in an undesired way. Resistors $R_1$ and $R_0$ are large, and would introduce further parasitic capacitance and slowdowns into the circuit. Using MOS transistors alone may be a further improvement.

Figure 5:
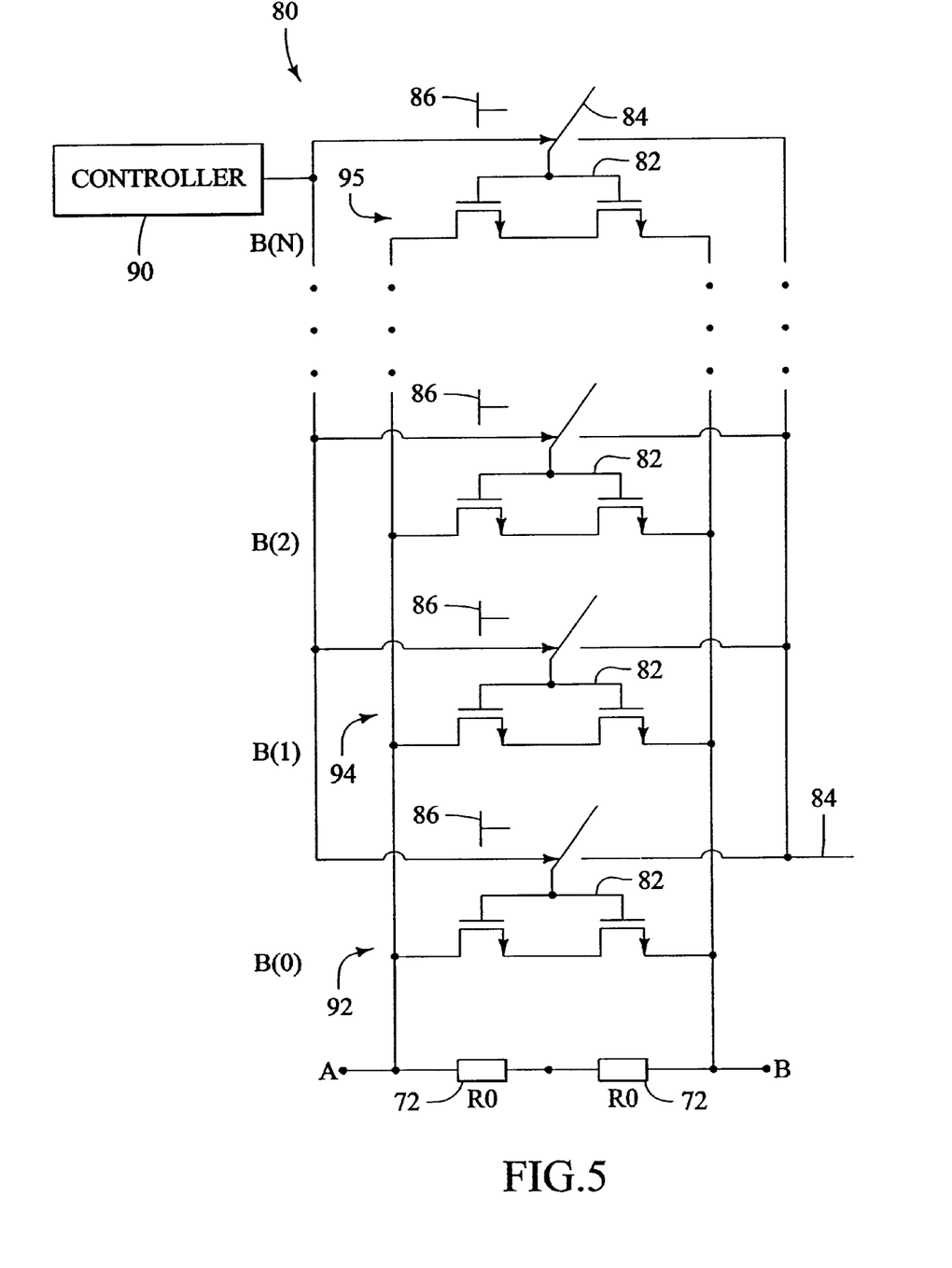

FIG. 5 depicts an alternative embodiment of an input resistor network embodiment 80 having N parallel series, where N equals 256. A code controller control circuit 90 connects to each of 256 switched series, from B(0) 92, B(1), 94 to B(N) 95. Each switched series consists not of a transistor and two resistances, but rather two transistors 82 in series. The transistors are operated in tandem, each series either on (closed) or off (open), by applying either a voltage to close or a ground to open the transistor circuits. When the transistors are closed, the drain-to-source resistances are in the resistance network circuit, as described above. In one embodiment, with a network where N=256, each transistor branch has a closed state resistance of about 50K to 100K ohm, while the $R_O$ resistors are about 100 ohm to 1K ohm, preferably 200–400 ohms.

This embodiment has the advantage of eliminating the $R_1$ resistors and their parasitic capacitance. In addition, the transistors may remain small, while their resistance is comparable to that of the much larger discrete resistances they replace. $R_O$ resistors 72 remain in the circuit. Voltage source 84 provides a gate voltage to the transistors selected by the code controller 90. For series not selected by the controller, their gates remain connected to ground 86. The gate voltage is selected such that the transistors operate in a linear region, that is, the transistors operate in a region where their resistance is inversely linear with respect to the voltage drop across the transistor. Put another way, their transconductance, a measure of conductivity across the transistors, is directly related to the voltage drop across the transistor or transistors. Other embodiments are also possible, such as three transistors in series, or two transistor and a resistor. In embodiments with only transistors, however, the resistance of each series is determined solely by the gate to source voltage and the transconductance of the transistors.

The controller of the code-controller circuit is preferably a programmable microprocessor controller. Other embodiments may include a digital signal processor, a signal processor, or a discrete digital or analog circuit that is able to accept and relay information concerning the amplification or code steps desired. Embodiments of amplifiers may have amplification steps from 1 to 10,000 and may include many powers of 2, including 512, 4096, or 8192, which numbers are most convenient, but not required. The amplifier may also have a gain from 1 to a high number, such as 10,000, the amplification being a resultant of the transconductances of the input portions and output portions and the input and output networks of the amplifier.

The use of transconductance-based current-mirror circuits tends to minimize the differences and variations in performance due to temperature. If the temperature of the local environment or the temperature of the circuit rises, the temperature of both the input and output portions will rise (or fall) in tandem, and so will any temperature-based coefficient of performance, such as resistance. Other electronic circuit performance factors may include the transconductance itself, a factor of the physical dimensions of the transistors and their circuitry. Therefore, an advantage of these circuits is relative immunity from temperature or environmental effects.

The performance of circuits embodying this design is preferably relatively independent of both materials and manufacturing effects, which may be considered "technology" effects. If there is a performance difference in the amplifier circuit due to changes in processing of the circuits, then the changes affect both the positive side and the negative side, both the input and the output portions of the amplifier circuit. The effects are equal on all sides, and the net performance change is zero or very close to it. This will apply to both large changes, such as changes in a manufacturing process, and to small changes, such as day-to-day processing temperature variations, material lot changes, carriers or atmospheres, and even furnaces or other processing conditions. With these performance advantages, amplifiers using these improvements may be implemented with supply voltages at 2 volts or lower.

Other advantages of the resistive networks of FIGS. 4 and 5 may include an almost "digital" application of the gain code gain steps without using a digital-to-analog converter. In one embodiment, the controller selects one resistance path at a time for increased or decreased resistance until the performance of the amplifier is satisfactory. In one embodiment, the controller controls an input resistance network. In another embodiment, the controller controls an output resistance network. In another embodiment, the controller controls both an input and an output resistance network.

Figure 6:
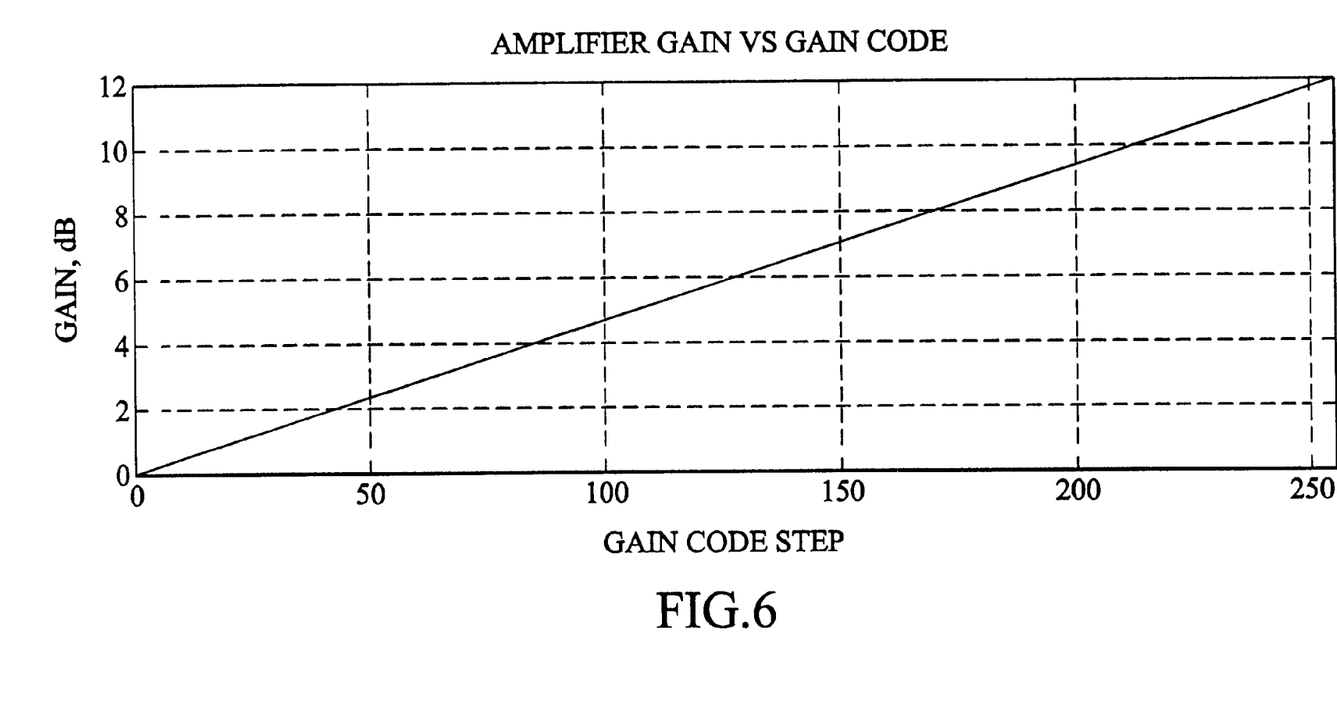
FIG. 6 is a logarithmic graph of the gain of an amplifier using the improved resistor networks.
Figure 7:
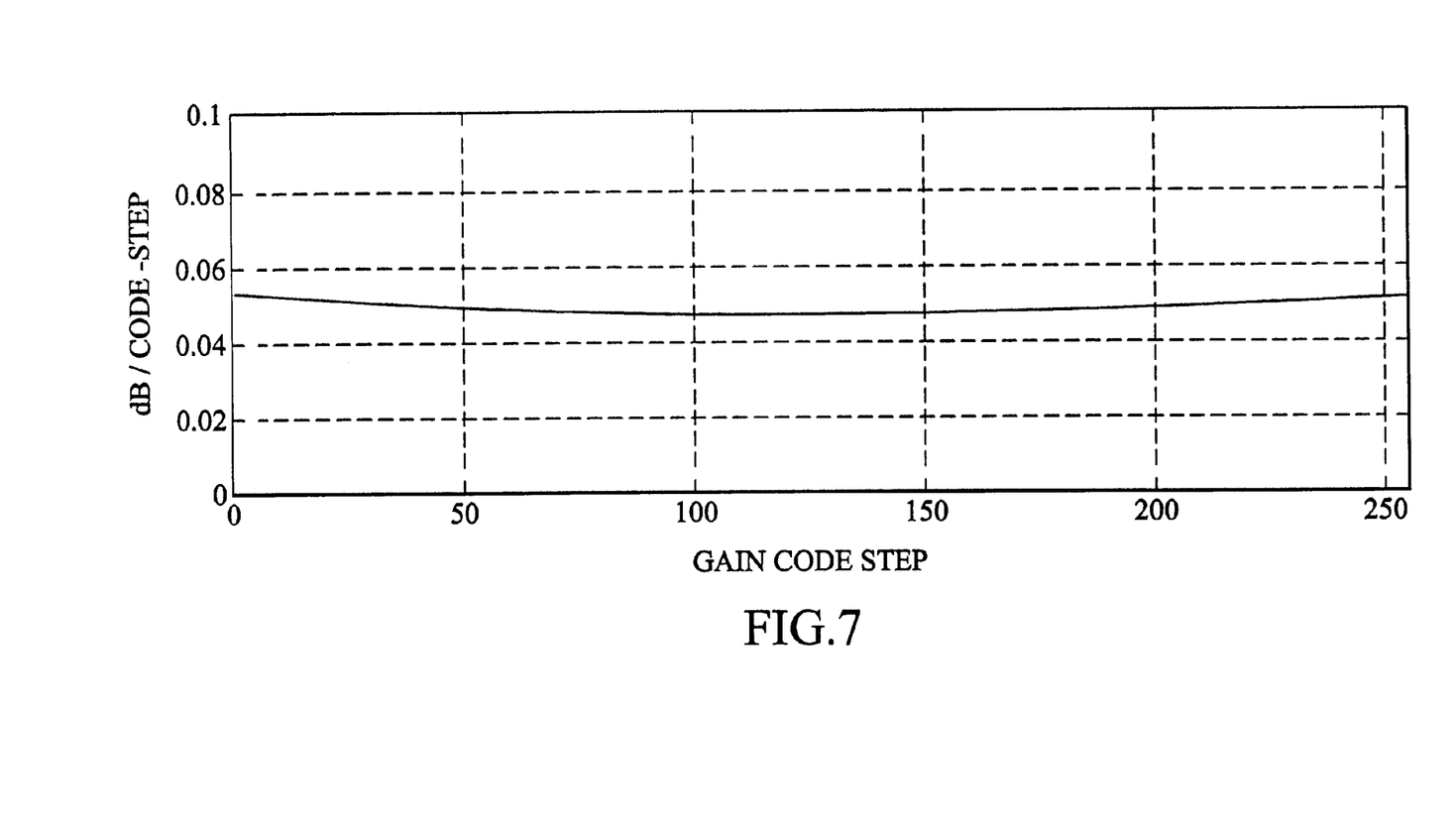
FIG. 7 is a graph of logarithmic gain deltas for each step.

The desired response of the amplifier is depicted in FIGS. 6 and 7. The gain code is selected from among the possible gain code steps. In one embodiment, there are N=256 steps or linear, parallel series in a resistance network. The controller may select from 0 to 255 steps of gain, that is, parallel resistive paths. In the previous example, a maximum gain of 4 was possible. In logarithmic terms, decibels of gain=20 $\log_{10}(V_2/V_1)$, where $V_2$ is the voltage output of the amplifier, and $V_1$ is the voltage input to the amplifier. In a system having a maximum gain of 4, the maximum decibels are 20 $\log_{10}(4/1)$=12.0.

FIG. 6 depicts the gain as one series after another is switched into the $R_{in}$ circuit (where all switches were open at the beginning), lowering the resistance of the input network. At the same time, one series after another is switched out of the Rout network (where all switches were closed at the beginning), increasing the resistance of the output network. Both modifications together increase the gain. When graphed logarithmically as in FIG. 6, the progression appears linear. It is also necessary that the gain increments be equal, as the controller steps through each increment. FIG. 7 depicts desirable performance of each step from steps 0 to 255. Note how each increment is very close to a value of about 0.05 dB per step. Such a resistor network may be used for the input network of the amplifier. It may also be used as an output network for the amplifier, with the provisions already outlined for common mode operating voltages.

Figure 8:
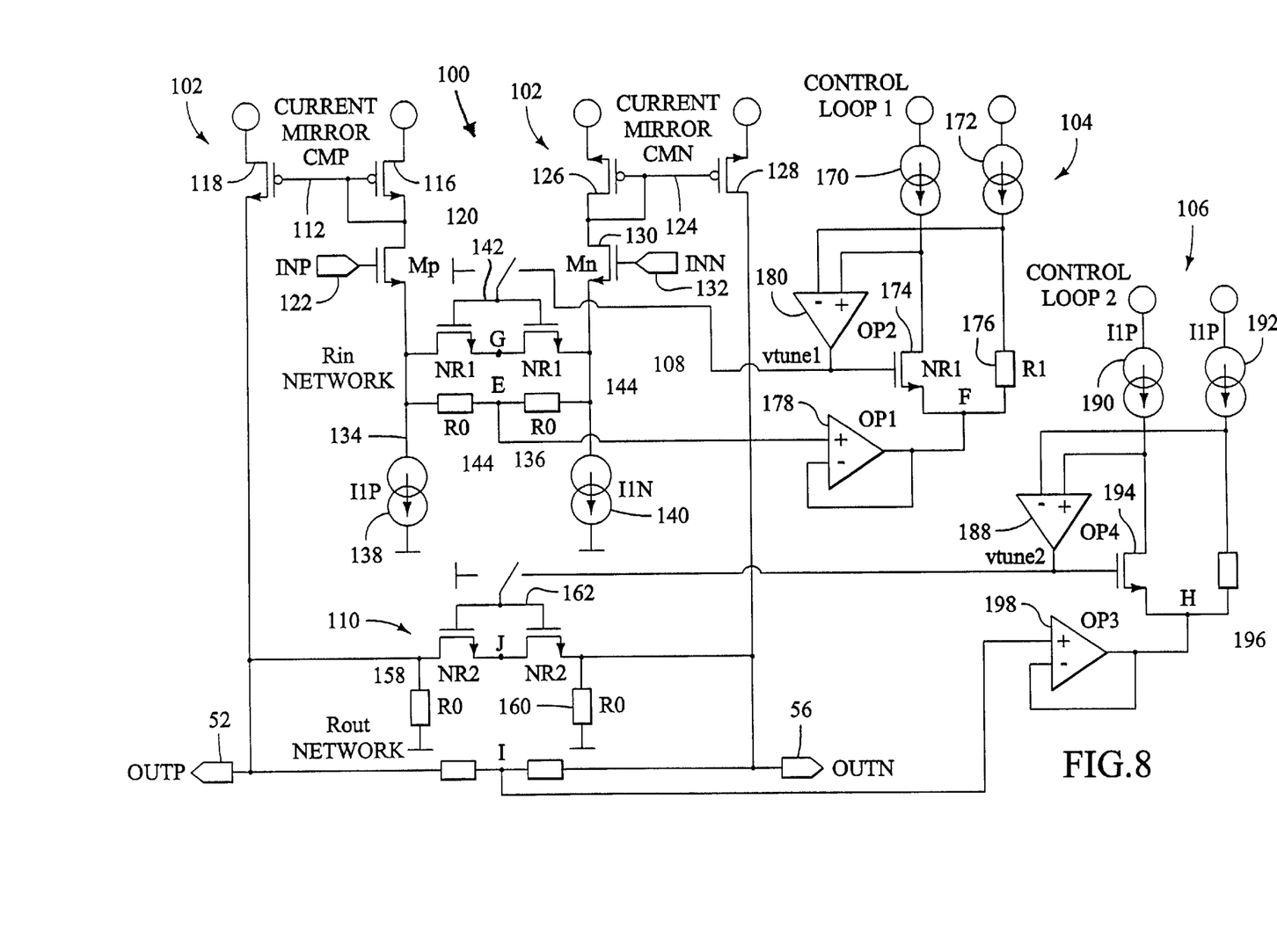
FIG. 8 is a simplified drawing of an improved amplifier using MOS switches.

FIG. 8 is an embodiment of an amplifier circuit with the resistor networks of FIG. 5 depicted in an abbreviated mode. The amplifier has input portion 100 and output portions 102. An input voltage signal is applied to positive terminal 122 and negative terminal 132, which may be the gates of transistors 120, 130. The input portion transistors 116, 126 and current sources 138, 140 generate an input current in the inner portion, the input current determined by the input voltage and the resistance in the Rin resistor network 108 and input resistors $R_O$ 144. The resistor network 108 has at least one series of MOS transistors 142. The input portion of the circuit is completed by traces or busbars 134, 136.

Input resistors $R_O$ need not be particularly accurate, that is, these resistors do not need to have a resistance very close to their target or nominal resistance value. In general terms, they are preferably within plus or minus 30 percent of their target or nominal value. It has been found, however, that within this parameter, the resistors preferably have resistances that match within about one percent. As an example, if a 1K value is desired, two input resistors having a resistance of 1250 ohms and 1260 ohms would be acceptable; while a pair of resistors having resistances of 980 and 1010 ohms would yield a poor result. These tolerances and guidelines also hold for the resistors used in embodiments according to FIG. 4.

The output portion 102 of the amplifier includes transistors 118, 128, $R_{out}$ network 110, resistors 158, 160 and output terminals 52, 56. In general, resistors 158 and 160 have resistances much smaller than the resistance network 110. The resistance network 110 includes N pairs of MOS transistors 162, in which each pair of transistors is controlled by a code controller circuit as outlined above. In one embodiment, the amplifier has a resistance network in the input portion of the amplifier. In another embodiment, the amplifier has a resistance network in the output portion of the amplifier. In yet another embodiment, the amplifier has a resistance network employing pairs of MOS transistors in both the input and the output resistance networks.

A further improvement involves a first control loop circuit 104 as shown in FIG. 8 to provide a gate voltage, $V_{tune1}$, to each series of gates in the resistance input network 108 selected by the code controller circuit. As described above, this gate voltage should be such that the MOS transistors operate in a linear or triode portion of their operating range. Current sources 170, 172 set up a current loop determined by the resistances in their paths, transistor 174 and resistor 176. Transistor 174 preferably has a transconductance N times larger than the MOS transistors used in the resistor series, where N is the number of series. Resistor 176 preferably has the same resistance value as resistor 144 in the $R_{in}$ network.

Equal currents from the current sources 170, 172 generate voltage drops across transistor 174 and resistor 176. OpAmp2 180 has its noninverting input connected to the drain of transistor 174, and its inverting input on the positive side of resistor 176. Opamp1 178, a voltage follower, provides unity gain and low input impedance to the output of the current loop set up in control loop 1 104. Opamp1 buffers the voltage at point F such that the voltage at point F equals the voltage at point E. The voltage at point E, the midpoint of the $R_O$ resistors, will also equal the midpoint voltage for each connected series of transistors 142.

The source of transistor 174 is therefore connected to the same voltage as the sources of transistors 142 in the $R_{in}$ network. Since the transconductance of transistor 174 is N times larger than the network transistors 142, transistor 174 replicates the resistance of N transistors connected in parallel, where N is the number of steps possible in the gain code of the given controller and circuit. In a similar manner, resistor 176 replicates the resistance of one resistor 144. With this circuit, the voltage drops across the transistor 174 and resistor 176 settle and equalize and thus determine the gate voltage applied to the gates of the $R_{in}$ network.

A further improvement involves second control loop 106 as shown in FIG. 8, to provide a gate voltage, $V_{tune2}$, to each series of gates in the resistor output network 110 selected by a code controller circuit. As described above, this gate voltage should be such that the MOS transistors operate in a linear or triode portion of their operating range. Current sources 190, 192 set up a current loop determined by the resistances in their paths, transistor 194 and resistor 196. Transistor 194 has a transconductance N times larger than the MOS transistors 162 used in the resistor series, where N is the number of series. Resistor 196 has the same resistance value as resistor 158 or 160 in the $R_{out}$ network.

Equal currents from the current sources 190, 192 generate voltage drops across transistor 194 and resistor 166. OpAmp4 188 has its noninverting input connected to the drain of transistor 194, and its inverting input on the positive side of resistor 196. Opamp3 198, a voltage follower, provides unity gain and low input impedance to the output of the current loop set up in control loop 2 106. Opamp3 buffers the voltage at point I such that the voltage at point I equals the voltage at point H. The voltage at point I, the midpoint of the output terminals, will also equal the midpoint voltage at Point J for each connected series of transistors 162. The source of transistor 194 is therefore connected to the same voltage as the sources of transistors 162 in the $R_{out}$ network. Since transistor 194 is N times larger than the network transistors 162, transistor 194 replicates the resistance of N transistors connected in parallel. Resistor 196 replicates the resistance of resistor 158 or 160. With this circuit, the voltage drops across the transistor 194 and resistor 196 settle and equalize and thus determine the gate voltage applied to the gates of the input resistance network.

In addition to controlling the resistance paths in use, the circuits of FIG. 8 disclose another element of control that is advantageous. The resistance of each path with at least one MOS transistor depends on the voltage applied to the gate. The embodiments disclosed include circuits for controlling the gate voltage on the input and output resistance network paths. Using a circuit to control gate voltages for the input and output resistors adds more degrees of freedom to the amplifier. A further advantage may be attained when as much as possible of the entire circuit as depicted in FIG. 8 is manufactured with MOS and CMOS technology at the same time, including input and output resistance networks, current mirrors, and control loops. An advantage is that such circuits preferably enjoy the same immunity from materials and manufacturing variations as the CMOS and MOS circuits described above for the input and output resistance networks.

Figure 9:
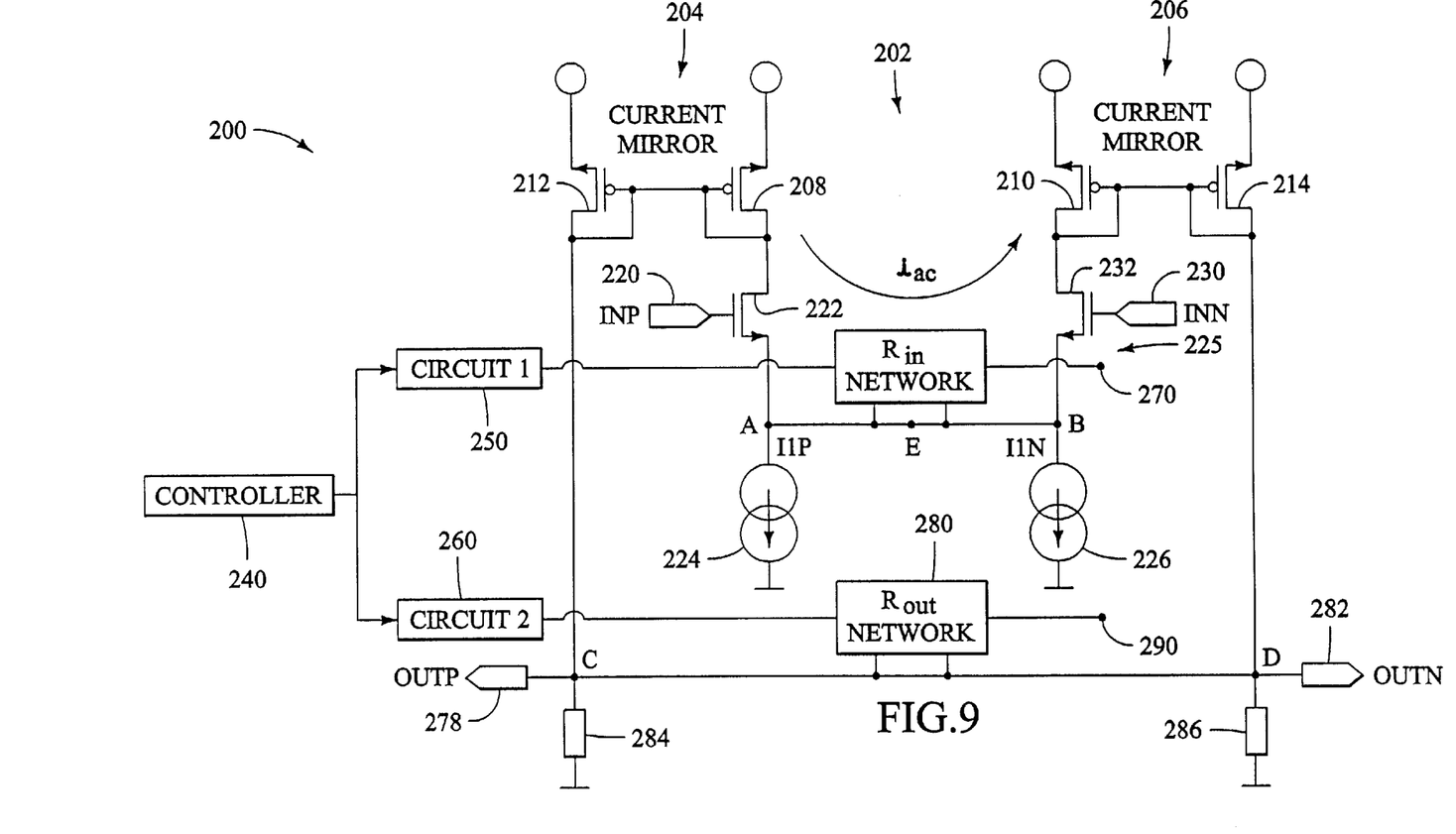
FIG. 9 is another embodiment using input and output networks.

FIG. 9 is another embodiment depicting the use of both input and output resistor networks by means of MOS switches. Amplifier 200 includes a current mirror input portion 202 and current mirror output portions 204, 206. The sources of the input and output portions are connected to a power source (not shown). The drain of the positive input portion transistor 208 is tied to its gate and to the gate of the output positive portion transistor 212. The drain of the negative input portion transistor 210 is also tied to its gate and to the gate of the output negative portion transistor 214. A voltage to be amplified is input to the input portion, a positive signal applied to the gate 220 of input positive transistor 222 and a negative signal to the gate 230 of input negative transistor 232.

The input portion includes current sources 224, 226 and an input resistor network 225 connected between the current sources at terminals A and B. The output portion of the amplifier has a transconductance $g_m$ a variable ratio of that of the input portion of the amplifier. Therefore, the voltage input to the input portion of the amplifier may be magnified at a variable ratio of the transfer function of the amplifier, and output at the output portion of the amplifier, through output terminals 278 and 282. An output resistor network 280 is connected between the output terminals, at points C and D, and the amplifier also includes resistors 284 and 286 as shown, connecting points C and D to ground.

In FIG. 9, the resistor networks are controlled by a microprocessor controller 240, responsive to adjust the input and output resistance networks. In one embodiment, the controller has two portions or circuits 250, 260 for controlling the input and output resistor networks 225, 280. The controller selects or does not select each parallel path in the input or output resistor networks. As described above, each series is connected either to ground (open circuit path) or to a gate voltage (closed, resistive path). The gate voltage for the input resistor network is supplied from input gate signal supply source 270, and for the output resistor network by output gate supply source 290.

Exemplary operating conditions in a useful embodiment would include the following. Power supply voltages from 1.5 to 2.5 volts are useful, in embodiments wherein peak amplitudes of the input and output terminals are about 100–150 mV. Gate voltages for the MOS transistors, to insure operation in their linear or "triode" region, are about 1.5 to about 3 volts, preferably 1.8 to about 2.5 volts. These are the voltages the control loops should produce as $V_{tune1}$ and $V_{tune2}$ in FIGS. 8 and 9. In one embodiment, the amplifier uses NMOS input transistors and PMOS current mirrors. In one embodiment, common-mode voltage at the input network (points A and B in FIG. 9) is about 0.5 volts, while common mode voltage at the output network (points C and D in FIG. 9) is about 1.2 volts, with an amplification of 12 dB at about 400 MHz. In another embodiment, the amplifier uses PMOS input transistors and NMOS current mirrors, reversing the common-mode voltages between points A/B and C/D.

Figure 10:
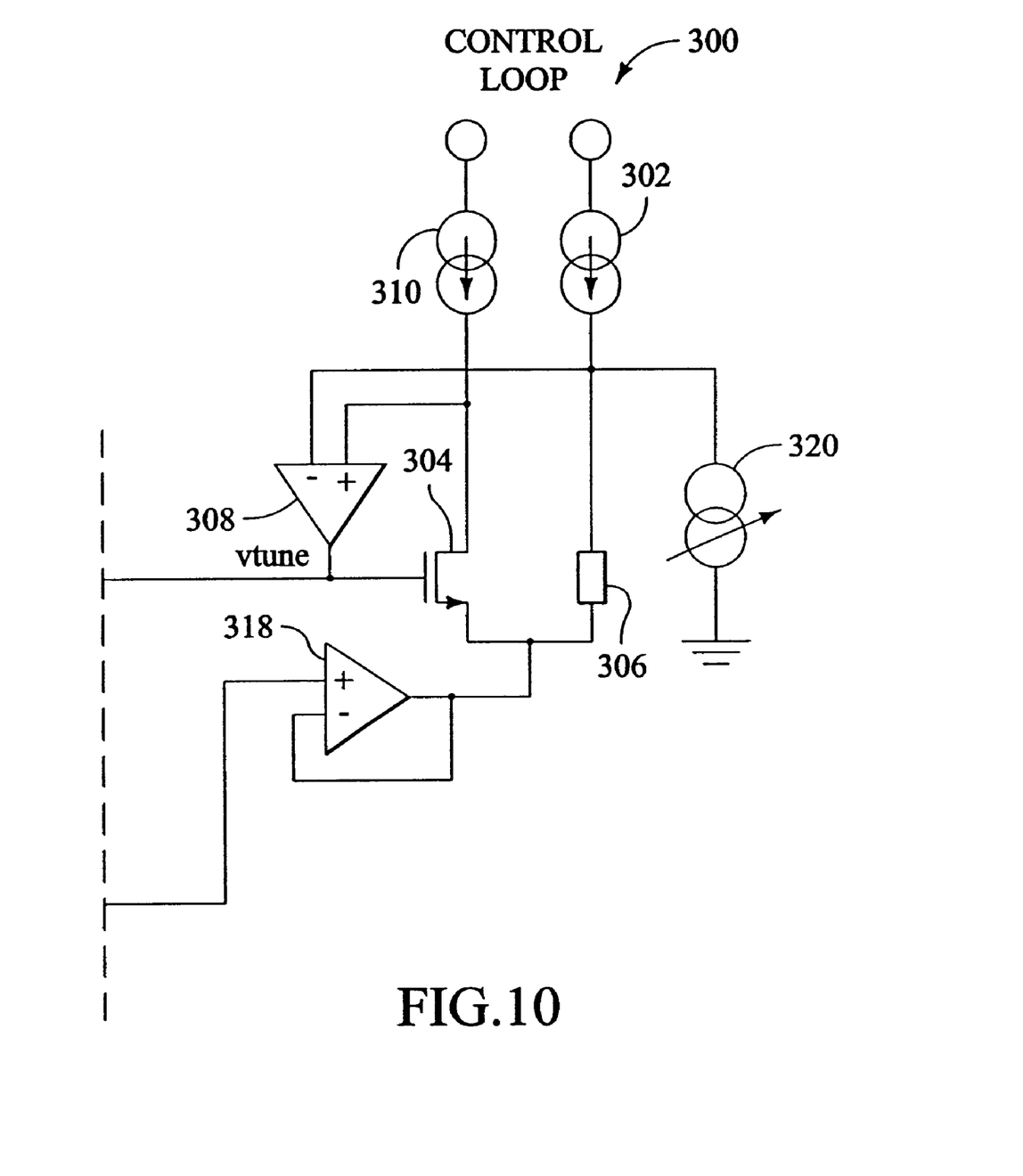
FIG. 10 is another embodiment useful for resistor networks.

FIG. 10 depicts a further improvement to the control loop circuits of FIGS. 8 and 9, in which the circuits are similar in components and functions to those shown in FIG. 8, but with the addition of a digital-to-analog converter. Control loop 300 uses current sources 302, 310, driving through a transistor 304 and a resistor 306, respectively. The circuit gains another degree of freedom by adding a programmable digital-to-analog converter 320 in parallel with the current sources. This adjustment allows greater control over the gain of the circuit, and thus accommodates mismatches in the resistors and transistors in the resistor networks. Opamps 308 and 318 function as before, with the goal of obtaining better control of the amplifier by adjusting the output voltage, $V_{tune}$, whether the circuit is meant for the input network of the output network.

Although only a few embodiments of the invention have been discussed, other embodiments are contemplated. For example, amplifiers with transconductance differences other than a factor of two may also be used. While a single pair of matching input resistors in series is contemplated, their function may be emulated by more than a single resistor each, such as two pair of resistors. The embodiments featured exemplify a single transistor or transistor pair, but a series of transistors or other mechanism for having a desired resistance may also be used. If it is desired to feature an input portion with low output impedance, an operational amplifier could be used for the input portion of the amplifier, along with an appropriate output portion. The embodiments of the parallel paths of the resistor networks use only one or two transistors; however, if desired, the concept may be extended to several transistors in series in each parallel path, if a relatively high degree of resistance variation in each "branch" is sought.

It is therefore intended that the foregoing description illustrates rather than limits this invention, and that it is the following claims, including all equivalents, which define this invention. Of course, it should be understood that a wide range of changes and modifications may be made to the embodiments described above. Accordingly, it is the intention of the applicants to protect all variations and modifications within the valid scope of the present invention.

What is claimed is:

1. A programmable open loop amplifier having a resistance network, the resistance network comprising:

two input resistors connected in series;

at least one MOS transistor connected in parallel with the input resistors; and a pair of matching resistors for each MOS transistor, the matching resistors connected in series with the MOS transistor, wherein a programmable controller applies a voltage to each MOS transistor gate, the voltage selected from the group consisting of a gate voltage and ground, and a gain of the amplifier is set by the resistance network.

2. The amplifier of claim 1, wherein the resistance network is an input resistance network, and is connected to an input of the amplifier.

3. The amplifier of claim 2, wherein applying a gate voltage to the gate of the at least one transistor causes the transistor to operate in a linear region.

4. The amplifier of claim 3, wherein a series resistance of each transistor and pair of matching resistors is equal to the resistance of a multiple of the two input resistors.

5. The amplifier of claim 1, wherein the resistance network is an output resistance network, and is connected to an output of the amplifier.

6. The amplifier of claim 5, wherein applying a gate voltage to the gate of the at least one transistor causes the transistor to operate in a linear region.

7. The amplifier of claim 6, wherein a series resistance of each transistor and pair of matching resistors is equal to a multiple of a resistance of output resistors, wherein the output resistors are connected between the network and ground.

8. The amplifier of claim 1, further comprising a gate voltage control circuit.

9. The amplifier of claim 8, wherein the voltage applied to the gate of at least one transistor is equal to a gate control voltage of the control circuit.

10. The amplifier of claim 8, wherein the gate voltage control circuit includes a programmable digital-to-analog converter.

11. A programmable open loop amplifier having an input resistance network, the input resistance network comprising:

two input resistors connected in series; and at least one pair of input MOS transistors connected in series, each of the at least one pair connected in parallel with the input resistors;

wherein a programmable controller applies a voltage to the gates of each pair of input MOS transistors, the voltage selected from the group consisting of a gate voltage and ground, and a gain of the amplifier is set by the resistance network.

12. The amplifier of claim 11, wherein applying a gate voltage to gates of the pair of transistors causes the transistors to operate in a linear region.

13. The amplifier of claim 12, wherein a resistance of each pair of input transistors is equal to a multiple of a resistance of the two input resistors.

14. The amplifier of claim 12, wherein the gate voltage is an output of an operational amplifier, and inputs to the operational amplifier are outputs of two current sources driving a first transistor whose transconductance is equal to a transconductance of all pairs of transistors, and a first resistor whose resistance is equal to an input resistor, and wherein a voltage at the joined outputs of the first transistor and the first resistor equals a voltage at a midpoint of the two input resistors.

15. The amplifier of claim 14, further comprising a voltage follower amplifier connected between the midpoint of the two input resistors and the joined first outputs.

16. The amplifier of claim 11, further comprising a positive output portion and a negative output portion connected respectively to a positive input portion and a negative input portion, the output portions having a transconductance which is a ratio greater than unity of a transconductance of the input portions.

17. The amplifier of claim 16, wherein the transconductance of the output portions of the amplifier are twice the transconductance of the input portions.

18. The amplifier of claim 15, further comprising a gate voltage control circuit.

19. The amplifier of claim 18, wherein the voltage applied to the gate of at least one transistor is equal to a gate control voltage of the control circuit.

20. The amplifier of claim 18, wherein the gate voltage control circuit includes a programmable digital-to-analog converter.

21. A programmable open loop amplifier having an output resistance network, the output resistance network comprising:
   at least one pair of output MOS transistors connected in series, each pair connected in parallel; and
   two output resistors, connected between the at least one pair of output MOS transistors and ground,
   wherein a programmable controller applies a voltage to gates of each pair of output MOS transistors, the voltage selected from the group consisting of a gate voltage and ground, and a gain of the amplifier is set by the network.

22. The amplifier of claim 21, wherein applying a gate voltage to gates of the pair of transistors causes the transistors to operate in a linear range.

23. The amplifier of claim 21, wherein a resistance of each transistor pair is equal to a multiple of a resistance of the output resistors.

24. The amplifier of claim 21, wherein the output gate voltage is an output of an operational amplifier, and inputs to the operational amplifier are outputs of two current sources driving a second output transistor, whose transconductance is equal to the transconductance of all the pairs of output transistors, and a second resistor, whose resistance is equal to a resistance of an output resistor, and wherein a voltage at the joined outputs of the second output transistor and the second output resistor equals a voltage at a midpoint of the output resistors.

25. The amplifier of claim 24, further comprising a voltage follower amplifier connected between the midpoint of the two output resistors and the joined second outputs.

26. The amplifier of claim 21, further comprising a positive output portion and a negative output portion connected respectively to a positive input portion and a negative input portion, the output portions having a transconductance which is a ratio greater than unity of a transconductance of the input portions.

27. The amplifier of claim 26 wherein the transconductance of the output portions of the amplifier are twice the transconductance of the input portions.

28. The amplifier of claim 25, further comprising an output gate voltage circuit.

29. The amplifier of claim 28, wherein the voltage applied to the gate of at least one transistor is equal to a gate control voltage of the control circuit.

30. The amplifier of claim 28, wherein the gate voltage control circuit includes a programmable digital-to-analog converter.

31. A programmable open-loop amplifier, comprising:
   an input resistance network connected to an input of the amplifier, the input resistance network further comprising at least one pair of input MOS transistors connected in series, each of the at least one pairs connected in parallel with two input resistors connected in series;
   an output resistance network connected to the output of the amplifier, the output resistance network further comprising at least one pair of output MOS transistors connected in series, each of the at least one pairs connected in parallel with two output resistors connected to ground;
   a first circuit supplying a first gate voltage to the gates of the input MOS transistors;
   a second circuit supplying a second gate voltage to the gates of the output MOS transistors; and
   a programmable controller,
   wherein the programmable controller applies a voltage to the gates of each pair of input MOS transistors, the voltage selected from the group consisting of the first gate voltage from the first circuit and ground, and the programmable controller applies a voltage to the gates of each pair of output MOS transistors, the voltage selected from the group consisting of the second gate voltage from the second circuit and ground, and a gain of the amplifier is set by the networks.

32. The amplifier of claim 31, applying the first gate voltage to a pair of input MOS transistors causes the input MOS transistors to operate in a linear region, and applying the second gate voltage to a pair of output MOS transistors causes the output MOS transistors to operate in a linear region.

33. The amplifier of claim 31, wherein the amplifier has positive and negative input portions and positive and negative output portions, and a transconductance of the output portions is a ratio greater than unity of a transconductance of the input portions.

34. The amplifier of claim 31, wherein a resistance of each of the at least one pair of input MOS transistors equals a series resistance of the input resistors.

35. A programmable open-loop amplifier, comprising:
   first transistor means for inputting a voltage signal;
   first transconductance means for varying a transconductance of the first transistor means for inputting, said first transconductance means connected to the means for inputting;
   second transistor means for amplifying and outputting the voltage signal, second transistor means connected to the output of the first transistor means for inputting;
   second transconductance means for varying a resistance of the means for outputting, said second transconductance means connected to the means for outputting; and
   means for programmably controlling the transconductance of the first and second transconductance means, said means for programmably controlling operably connected to the first transconductance means and the second transconductance means, wherein a gain of the amplifier is set by the transconductances.

36. The amplifier of claim 35, wherein the gain is from 1 to 10,000.

37. The amplifier of claim 36, further comprising a first control loop means for controlling the first transconductance means and a second control loop means for controlling the second transconductance means.

* * * * *